United States Patent
Maldo et al.

(10) Patent No.: US 11,222,832 B2
(45) Date of Patent: Jan. 11, 2022

(54) POWER SEMICONDUCTOR DEVICE PACKAGE

(71) Applicant: SEMICONDUCTOR COMPONENTS INDUSTRIES, LLC, Phoenix, AZ (US)

(72) Inventors: Tiburcio Maldo, Consolacion (PH); Keunhyuk Lee, Suzhou (CN); Jerome Teysseyre, Scottsdale, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/513,437

(22) Filed: Jul. 16, 2019

(65) Prior Publication Data

US 2020/0258824 A1 Aug. 13, 2020

Related U.S. Application Data

(60) Provisional application No. 62/803,709, filed on Feb. 11, 2019.

(51) Int. Cl.
*H01L 23/495* (2006.01)
*H01L 23/538* (2006.01)
(Continued)

(52) U.S. Cl.
CPC ........ *H01L 23/49575* (2013.01); *H01L 21/56* (2013.01); *H01L 23/3121* (2013.01);
(Continued)

(58) Field of Classification Search
CPC ........... H01L 23/49575; H01L 23/3121; H01L 23/367; H01L 23/3735; H01L 23/49503; H01L 23/49517; H01L 23/49562; H01L 23/5385; H01L 21/56; H01L 29/49562; H01L 2224/0603; H01L 2924/181; H01L 23/3107; H01L 21/561; H01L 23/4334; H01L 23/49531; H01L 25/074; H01L 25/18; H01L 24/81; H01L 2924/00012; H01L 23/043–051; H01L 24/50;
(Continued)

(56) References Cited

U.S. PATENT DOCUMENTS 7,005,734 B2 2/2006 Choi et al.
7,663,211 B2 2/2010 Noquil et al.
(Continued)

*Primary Examiner* — Cuong B Nguyen
(74) *Attorney, Agent, or Firm* — Brake Hughes Bellermann LLP

(57) ABSTRACT

In a general aspect, an apparatus can include a leadframe. The apparatus can also include a first semiconductor die coupled with a first side of a first portion of the leadframe, and a second semiconductor die coupled with a second side of the first portion of the leadframe. The apparatus can also include a first substrate coupled with a second side of the first semiconductor die. The first substrate can be further coupled with a first side of a second portion of the leadframe and a first side of a third portion of the leadframe. The apparatus can also further include a second substrate coupled with a second side of the second semiconductor die. The second substrate can be further coupled with a second side of the second portion of the leadframe and a second side of the third portion of the leadframe.

21 Claims, 7 Drawing Sheets

(51) Int. Cl.
*H01L 21/56* (2006.01)
*H01L 23/367* (2006.01)
*H01L 23/373* (2006.01)
*H01L 23/31* (2006.01)

(52) U.S. Cl.
CPC ........ *H01L 23/367* (2013.01); *H01L 23/3735* (2013.01); *H01L 23/49503* (2013.01); *H01L 23/49517* (2013.01); *H01L 23/49562* (2013.01); *H01L 23/5385* (2013.01)

(58) Field of Classification Search
CPC ..... H01L 23/373–3738; H01L 29/7842–7849; H01L 2924/351–35121; H01L 21/4821–4867; H01L 21/4875; H01L 2021/60–607
USPC ........................................................ 257/676
See application file for complete search history.

(56) References Cited

U.S. PATENT DOCUMENTS

| | | |
|---|---|---|
| 9,437,528 B1 | 9/2016 | Gong et al. |
| 10,002,821 B1* | 6/2018 | Hoegerl ............. H01L 23/4334 |
| 2002/0113304 A1 | 8/2002 | Doh et al. |
| 2002/0130399 A1* | 9/2002 | Moon ............... H01L 23/49524 |
| | | 257/666 |
| 2004/0251557 A1* | 12/2004 | Kee .................. H01L 23/49575 |
| | | 257/777 |
| 2009/0146271 A1* | 6/2009 | Chin .................. H01L 23/3107 |
| | | 257/666 |
| 2020/0375061 A1* | 11/2020 | Alawieh ................ H01L 25/50 |

\* cited by examiner

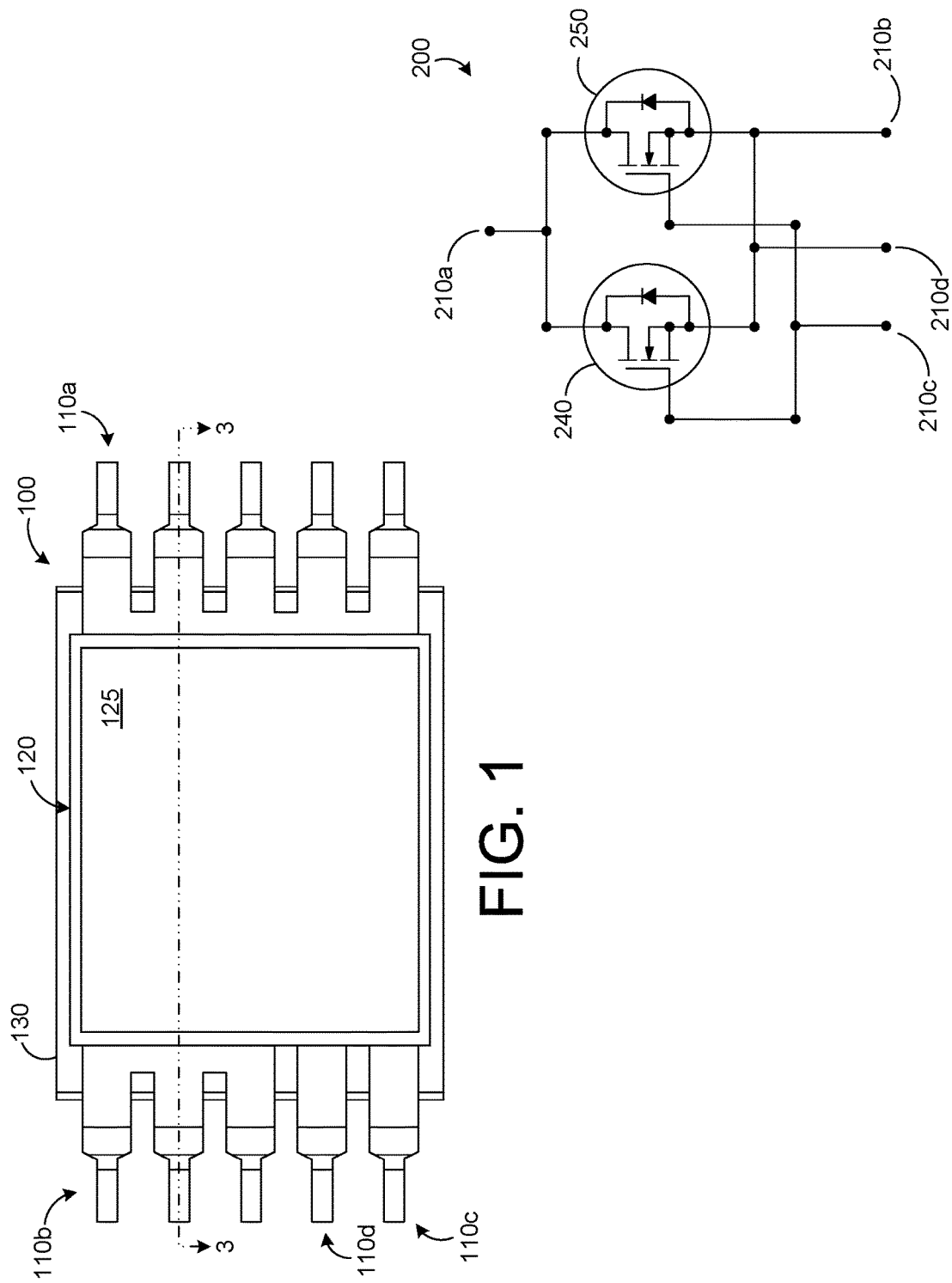

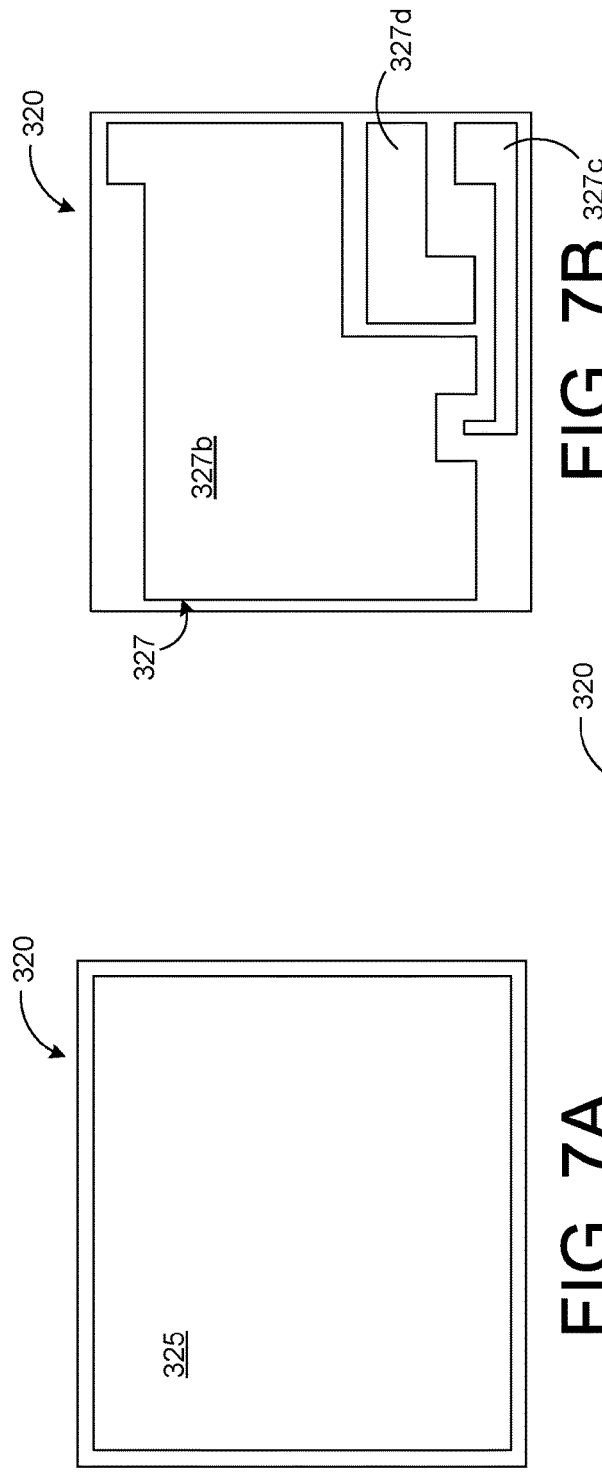

POWER SEMICONDUCTOR DEVICE PACKAGE

TECHNICAL FIELD

This description relates to semiconductor device package apparatus. More specifically, this description relates to semiconductor device packages that include multiple semiconductor die with isolated (e.g., electrically isolated) dual-side cooling.

BACKGROUND

A trend for power semiconductor device (e.g., power semiconductor devices used in electric vehicles (EVs) and/or hybrid-electric vehicles (HEVs) is to higher voltage, higher power devices, such as power semiconductor devices implemented in Silicon Caribe (SiC), Gallium Arsenide (GaAs), Gallium Nitride (GaN), and/or so forth. For instance in the EV and/or HEV automotive markets. For instance, the trend is to use such power semiconductor devices for power train inverters, direct current to direct current (DC-DC) converters, and/or on board chargers (OBCs). As the power capabilities of such devices can be 10 times (or more) greater than Silicon devices, this trend presents certain challenges, such as producing semiconductor device packages that can allow for higher current/power ratings, provide sufficiently low impedance (e.g., inductance), and have high thermal dissipation performance.

SUMMARY

In a general aspect, an apparatus can include a leadframe having a first portion, a second portion and a third portion. The apparatus can also include a first semiconductor die having a first side coupled with a first side of the first portion of the leadframe, and a second semiconductor die having a first side coupled with a second side of the first portion of the leadframe. The apparatus can further include a first substrate having a first side coupled with a second side of the first semiconductor die. The first side of the first substrate can be further coupled with a first side of the second portion of the leadframe and a first side of the third portion of the leadframe. The apparatus can still further include a second substrate having a first side coupled with a second side of the second semiconductor die. The first side of the second substrate can be further coupled with a second side of the second portion of the leadframe and a second side of the third portion of the leadframe.

In another general aspect, an apparatus can include a first direct bonded-metal (DBM) substrate and a first semiconductor die that is flip-chip mounted on the first DBM substrate. The apparatus can also include a second DBM substrate and a second semiconductor die that is flip-chip mounted on the second DBM substrate. The apparatus can further include a leadframe having a first portion including a die attach paddle (DAP), a second portion and a third portion. The first semiconductor die can be coupled with a first side of the DAP. The second semiconductor die can be coupled with a second side of the DAP. The first DBM substrate can be coupled with a first side of the second portion of the leadframe and a first side of the third portion of the leadframe. The second DBM substrate can be coupled, via a first spacer, with a second side of the second portion of the leadframe and, via a second spacer, a second side of the third portion of the leadframe.

In another general aspect, a method can include constructing a first sub-assembly including: coupling a first side of a first semiconductor die with a first direct-bonded metal (DBM) substrate; coupling a second side of the first semiconductor die with a first side of a first leadframe portion; coupling the first DBM substrate with a first side of a second leadframe portion; and coupling the first DBM substrate with a second side of a third leadframe portion. The method can also include constructing a second sub-assembly including: coupling a first side of a second semiconductor die with a second DBM substrate; coupling a first spacer with the second DBM substrate; and coupling a second spacer with the second DBM substrate. The method can still further include constructing an assembly by coupling the second sub-assembly with the first sub-assembly including: coupling a second side of the second semiconductor die with a second side of the first leadframe portion; coupling the first spacer with a second side of the second leadframe portion; and coupling the second spacer with a second side of the third leadframe portion.

BRIEF DESCRIPTION OF THE DRAWINGS

FIG. 1 is a diagram illustrating a semiconductor device package, according to an implementation.

FIG. 2 is a schematic diagram illustrating a circuit that can be implemented in the semiconductor device package of FIG. 1.

FIGS. 7A-7C are diagrams illustrating various views of a direct-bonded metal (DBM) substrate that can be included in a semiconductor device package, according to an implementation.

DETAILED DESCRIPTION

Figure 3:
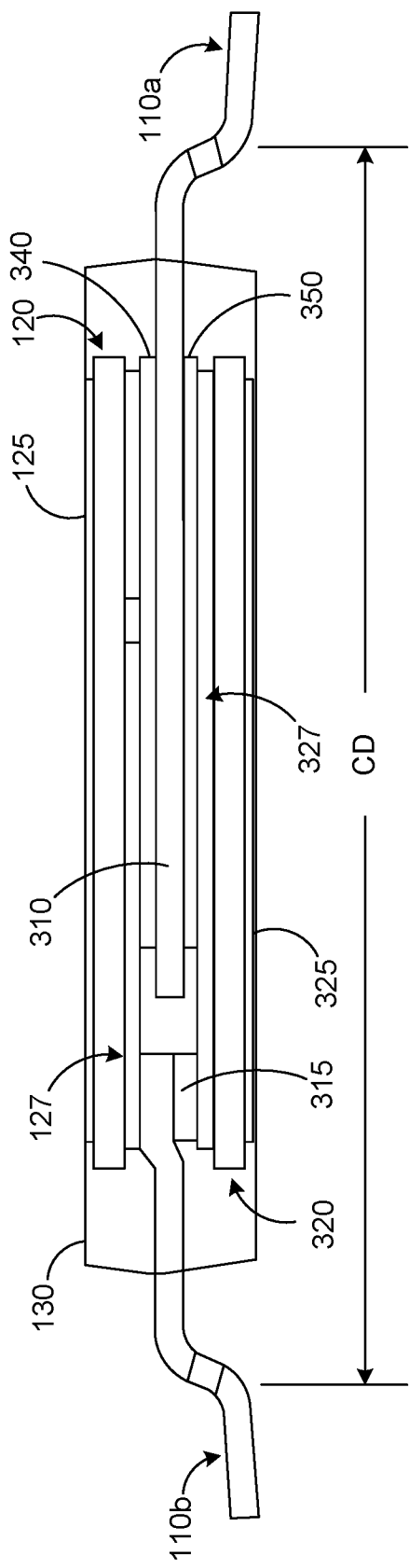
FIG. 3 is a diagram illustrating a cross-sectional view of the semiconductor device package of FIG. 1, according to an implementation.

This disclosure is directed to implementations of semiconductor device packages (and associated manufacturing methods) that can address challenges associated with the trend toward higher power semiconductor devices. For instance, the approaches described herein can address the challenges discussed above, e.g., can provide semiconductor device packages that allow for higher current/power ratings, provide sufficiently low electrical impedance (e.g., inductance), and have high thermal dissipation capability. For instance, the approaches described herein can provide for implementing multiple (e.g., parallel connected) power semiconductor devices (e.g., power transistors) in a single semiconductor device package. The approaches described herein also allow for dual-sided cooling, which can improve thermal dissipation performance.

Further, the approaches described herein can provide electrical isolation between substrates (e.g., multiple substrates) in a semiconductor device package. This electrical isolation can provide certain advantages, such as for printed circuit board layout in high voltage applications. For instance, in some implementations, such electrical isolation can allow for more efficient printed circuit board layout, e.g., by allowing for closer proximity, on an associated circuit board, of other devices to high voltage devices implemented in semiconductor device packages described herein.

The approaches described herein can provide compact package solutions with low impedance (e.g., inductance, etc.), and longer creepage distances for high voltage applications, as compared to current implementations of power semiconductor devices. In some implementations, creepage distance can refer to a shortest distance between a signal lead connected to electrical ground and a signal lead connected to a high voltage supply (e.g., 400 V or greater), where such creepage distance is measured between electrical connections of such signal leads when the semiconductor device package is coupled to (mounted on, affixed to, soldered to, etc.) a printed circuit board (PCB). Longer creepage distance can be beneficial, as it can prevent current leakage (current creep) and/or arcing between high-voltage connected and ground connected pins. For example, in some implementations, creepage distance can be a shortest distance between signal lead(s) that are connected to a drain terminal of a power metal-oxide semiconductor field-effect transistor (MOSFET) and signal lead(s) that are connected to a source terminal of the MOSFET.

FIG. 1 is a diagram illustrating a semiconductor device package (package) 100, according to an implementation. For purposes of illustration and discussion, in FIG. 1, aspects of the package 100 are shown that may be not be visible in example implementations, such as elements that may be disposed internal to the package 100 (e.g., within a molding compound). FIG. 1 also includes a section line 3-3 that can correspond, in an example implementation, with the cross-sectional view shown in FIG. 3.

In the drawings, like or similar elements for the illustrated example implementations are indicated using like reference numbers. However, in some implementations, variations of such elements are possible. For example, different substrate layouts (e.g., bonded-metal) layouts are possible, different leadframe configurations are possible, different power semiconductor devices can be implemented in the package 100, the package 100 can include additional semiconductor die (e.g., respective diodes connected in parallel with each of two power semiconductor transistors included in the package 100), etc.

As shown in FIG. 1, the package 100 can include a leadframe having multiple portions 110a, 110b, 110c and 110d. The portions 110a-110d can be collectively referred to as leadframe 110. As shown in FIG. 1, each portion of the leadframe 110 can include one or more signal leads (e.g., signal leads, etc.). For instance, in this example, the leadframe portion 110a includes five (5) signal leads, the leadframe portion 110b includes three (3) signal leads, and the leadframe portions 110c and 110d each include, respectively, one (1) signal pin. In some implementations, the leadframe 110 can include additional or fewer portions. In some implementations, one or more of the leadframe portions 110a-110d can include a different number of pins.

In the example implementation of FIG. 1, the leadframe portion 110a can include a die-attach paddle (DAP), such as shown, e.g., in FIG. 3, where a first power semiconductor device (e.g., a first MOSFET included on a first semiconductor die) can be coupled (electrically coupled, soldered, etc.) with a first side of the DAP, and a second power semiconductor device (e.g., a second MOSFET included on a first semiconductor die) can be coupled (electrically coupled, soldered, etc.) with a second side (opposite the first side) of the DAP. In some implementations, the DAP can operate as a common drain terminal of a first MOSFET and a second MOSFET, such as a terminal 210a in the circuit 200 shown in FIG. 2.

As also shown in FIG. 1, the package 100 can also include a substrate 120 that is coupled (electrically coupled) with the first power semiconductor device (e.g., with a source of the first MOSFET, a gate of the first MOSFET and/or a source-sense terminal of the first MOSFET). In some implementations, such as in the example device 100, the substrate 120 can also provide electrical connections between a first MOSFET and the leadframe portions 110b, 110c and 110d. For instance, in some implementations, the substrate 120 can provide an electrical connection between a source of first MOSFET and the leadframe portion 110b, an electrical connection between a gate of the first MOSFET and the leadframe portion 110c, and an electrical connection between the leadframe portion 110d and the source of the first MOSFET (e.g., as a source-sense terminal).

In some implementations, the substrate 120 can be a direct-bonded metal (DBM) substrate, such as a direct-bonded copper (DBC) substrate. As shown in FIG. 1, the substrate 120 can include a metal pattern 125 that is exposed through a molding compound 130 of the package 100. In some implementations, a heat sink can be coupled with the metal pattern 125 to provide thermal dissipation for the package 100 (e.g., to dissipate heat generated by power semiconductor devices that are implemented in the package 100).

Figure 9:
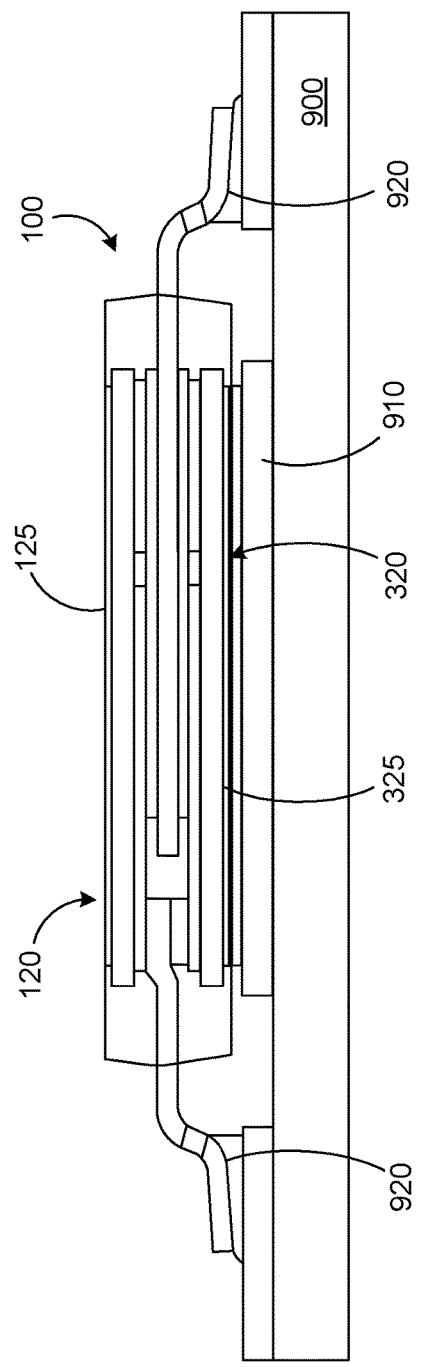
FIG. 9 is a diagram illustrating a semiconductor device package coupled with a printed circuit board, according to an implementation.

While not shown in FIG. 1, the package 100 can include a second substrate that is electrically coupled with the second power semiconductor device (e.g., similarly to the substrate 120 and the first power semiconductor device discussed above). For instance, the second power semiconductor device can be a second MOSFET, and the second substrate can provide an electrical connection between a source of second MOSFET and the leadframe portion 110b, provide an electrical connection between a gate of the second MOSFET and the leadframe portion 110c, and provide an electrical connection between the leadframe portion 110d and the source of the source MOSFET (e.g., as a source-sense terminal). In this example, the leadframe portion 110b can operate as a common source terminal of the first MOSFET and the second MOSFET, the leadframe portion 110c can operate as a common gate terminal of the first MOSFET and the second MOSFET, and leadframe portion 110d can operate as a common source-sense terminal of the first MOSFET and the second MOSFET. In this example, the second substrate can also include a metal pattern similar to the metal pattern 125 to facilitate efficient thermal dissipation from an opposite side of the package 100 (e.g., opposite from the view shown in FIG. 1). Accordingly, the package 100 can be referred as implementing dual-sided cooling. In some implementations, the metal pattern of such a second substrate can be coupled with (e.g., soldered to, etc.) a power pattern (e.g., a power plane) of a printed circuit board (PCB) on which the package 100 is implemented (such as shown in FIG. 9), such as a ground plane.

FIG. 2 is a schematic diagram illustrating a circuit 200 that can be implemented in the semiconductor device package of FIG. 1. As shown in FIG. 2, the circuit 200 can include terminals 210a, 210b, 210c and 210d, a first power semiconductor device (e.g., MOSFET) 240 and a second power semiconductor device (e.g., MOSFET) 250. While the power semiconductor devices 240 and 250 in FIG. 2 are illustrated, by way of example, as MOSFET devices, in some implementations, the first power semiconductor device 240 can include a diode, an insulated-gate bipolar transistor (IGBT), a bipolar transistor, and/or a MOSFET device. Similarly, the second power semiconductor device 250 can include a diode, an insulated-gate bipolar transistor (IGBT), a bipolar transistor, and/or a MOSFET device.

In some implementations, the power semiconductor devices 240 and 250 can be implemented on respective first and second semiconductor die, where each of the semiconductor die can be coupled with a respective substrate (e.g., a respective DBM substrate). For instance, each of the semiconductor die can each be flip-chip mounted on a respective substrate. In this example, each of the semiconductor die can also be coupled with respective sides of a DAP paddle of a leadframe portion (e.g., the portion 110a of the leadframe 100 discussed above).

As shown in FIG. 2, in the circuit 200, the terminals 210a-210d are each common to both of the power semiconductor devices 240 and 250. For instance, in the example of FIG. 2, the terminal 210a can be a common drain terminal, the terminal 210b can be a common source terminal, the terminal 210c can be a common gate terminal, and the terminal 210d can be a common source-sense terminal. In an example implementation, the terminal 210a can be implemented by the leadframe portion 110a, the terminal 210b can be implemented by the leadframe portion 110b, the terminal 210c can be implemented by the leadframe portion 110c, and the terminal 210d can be implemented by the leadframe portion 110d. In some implementations (e.g., where the power semiconductor devices 240 and 250 are implemented as IGBTs), the terminal 210a can be a common collector terminal, the terminal 210b can be a common emitter terminal, the terminal 210c can be a common gate terminal, and the terminal 210d can be a common emitter-sense terminal. In some implementations, an emitter sense terminal can be omitted (excluded, etc.)

FIG. 3 is a diagram illustrating a cross-sectional view of an example implementation of the semiconductor device package 100 of FIG. 1. The view of FIG. 3 corresponds with the section line 3-3 shown in FIG. 1. In the example and view of the FIG. 3, the package 100 includes the leadframe portion 110a, the leadframe portion 110b, the DBM substrate 120, the molding compound 130, a first semiconductor die 340 (e.g., implementing a first power semiconductor device) and a second semiconductor die 350 (e.g., implementing a second power semiconductor device). For purposes of illustration, the first semiconductor die 340 and the second semiconductor die 350 will be described as implementing, respectively, a first power MOSFET and a second power MOSFET. In some implementations, different power semiconductor devices can be implemented by the semiconductor die 340 and 350.

As shown in FIG. 3, the leadframe portions 110a and 110b (as well as the leadframe portion 110c and 110d, which are not shown) can include gull-wing type signal leads. Such signal leads can provide good thermal-mechanical reliability for the package 100. For instance, such gull-wing type leads are flexible, which can reduce damage to the package 100, and/or solder connections between the signal leads and a PCB (or other substrate) on which the package 100 is disposed due to thermal cycling of the package 100 and/or due to coefficient of thermal expansion mismatches between materials include in the package 100, or an associated PCB or substrate with which the package is coupled or disposed on.

As shown in FIG. 3, the leadframe portion 110a can include a die attach paddle (DAP) 310. In this example, a first side of the semiconductor die 340 (e.g., a backside drain contact) can be coupled with (soldered to, etc.) a first side of the DAP 310, and a first side of the semiconductor die 350 (e.g., a backside drain contact) can be coupled with (soldered to, etc.) a second side of the DAP 310. In this example, the DAP 310 (and the leadframe portion 110a) would operate as a common drain terminal for the MOSFETs of the semiconductor die 340 and 350.

Figure 4:
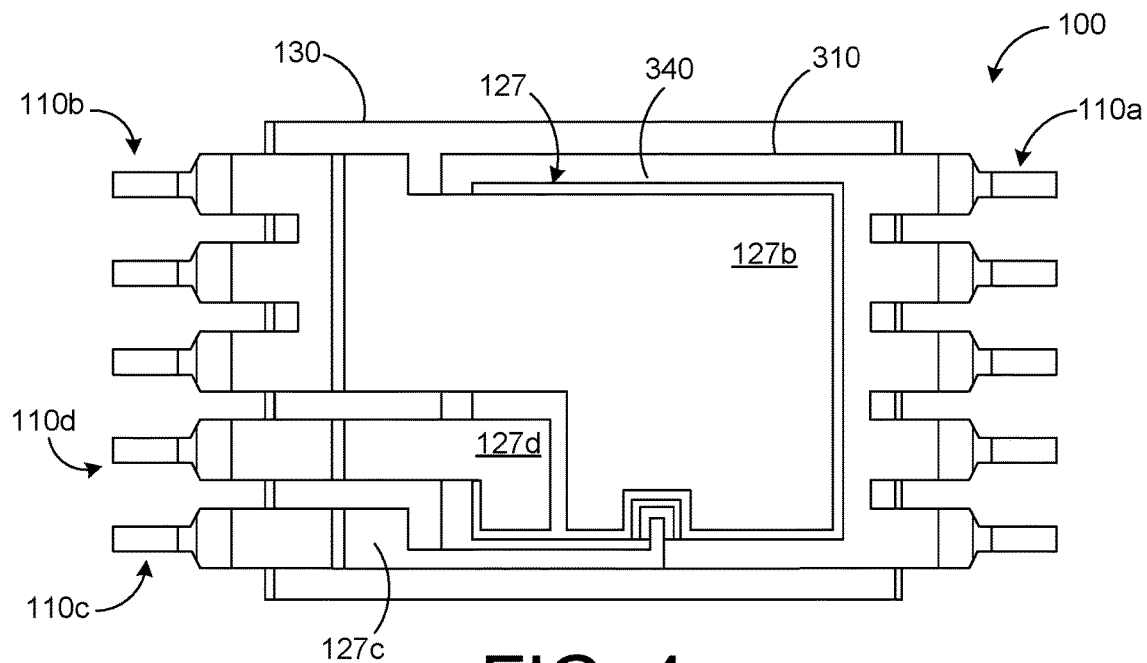
FIG. 4 is a diagram illustrating a bonded-metal pattern of a substrate included in a semiconductor device package, such as the semiconductor device package of FIG. 1, according to an implementation.
Figure 5:
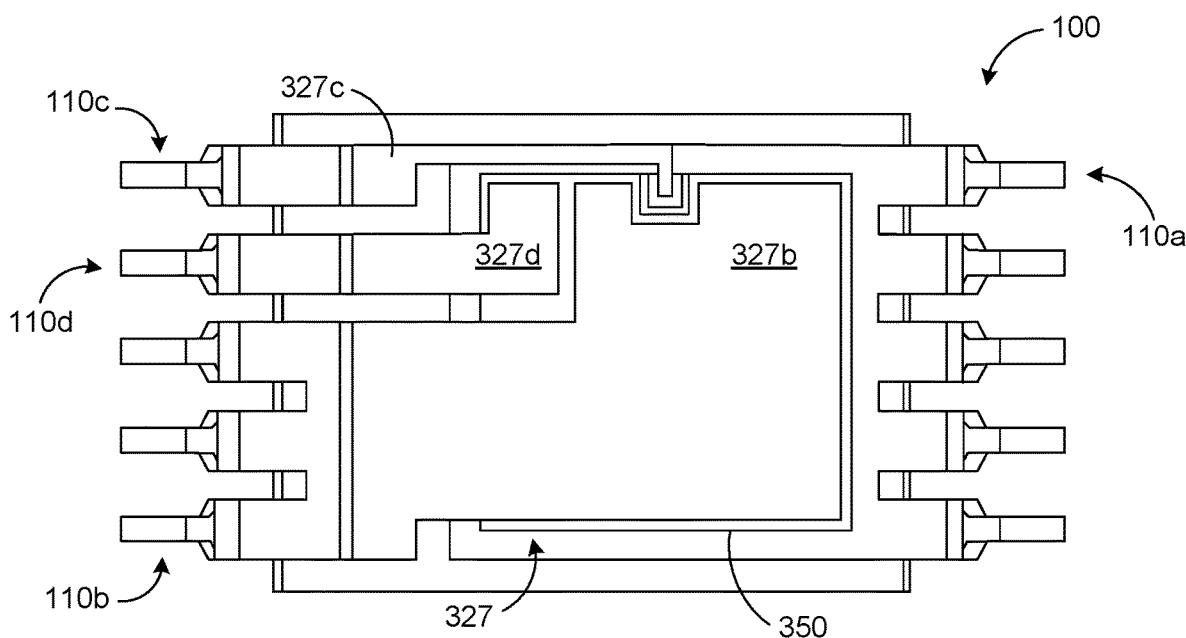
FIG. 5 is a diagram illustrating aspects of a bonded-metal pattern of another substrate included a semiconductor device package, such as the semiconductor device package of FIG. 1, according to an implementation.

As shown in FIG. 3, in this example, the package 100 can also include a conductive (e.g., copper) spacer 315 and a second DBM substrate 320. In the example implementation of the package 100 shown in FIG. 3, a second side of the semiconductor die 340 can be coupled with a bonded-metal pattern 127 disposed on a first side of the DBM substrate 120. Likewise, a second side of the semiconductor die 350 can be coupled with a bonded-metal pattern 327 disposed on a first side of the DBM substrate 320. In this example, the bonded metal patterns 127 and 327 (examples of which are shown in FIGS. 4, 5 and 7B) can provide, at least in part, respective electrical connections between source terminals of the semiconductor die 340 and 350 and the leadframe portion 110b, respective electrical connections between gate terminals of the semiconductor die 340 and 350 and the leadframe portion 110c (not shown), and respective electrical connections between source terminals of the semiconductor die 340 and 350 and the leadframe portion 110d (not shown), e.g., as a common source-sense terminal. As shown in FIG. 3, the spacer 315 can be used to electrically couple the second substrate with the leadframe portion 110b. In some implementations, additional spacers can be used to couple (electrically couple) the second substrate with other respective leadframe portions (e.g., such as the leadframe portions 110c and 110d). The spacer 315 (e.g., as well as additional spacers), in addition to the substrates 120 and 320 (e.g., such as the example substrates described herein) allow for the semiconductor die 340 and 350 to be connected to a singe (e.g., multi-portion) leadframe, such as the leadframe 110. Such arrangements can allow for the implementation of multiple power semiconductor devices (e.g., such as in the circuit shown in FIG. 2) to be implemented in a single semiconductor device package, such as the package 100, or other semiconductor packages that include a single leadframe, such as the leadframe 110.

In the example of FIG. 3, the second substrate 320, on a second side opposite from the bonded-metal pattern 327, can include a bonded-metal pattern 325 that is exposed, similar to the bonded-metal pattern 125 of the DBM substrate 120, through the molding compound 130. The metal patterns 125 and 325 can facilitate dual-sided cooling for the package 100, such as using the approaches described herein. Depending on the particular implementation (e.g., desired thermal dissipation capability), different materials can be used for the substrates 120 and 320. For instance, the substrates 120 and 320 can include ceramic, aluminum nitride, silicon nitride, aluminum oxide, beryllium oxide, etc. Further, due the arrangement of the substrates 120 and 320 and their respective metal patterns 125 and 325, in this example, the metal pattern 125 is electrically isolated from the metal pattern 325. Further, the metal patterns 125 and 325 are also electrically isolated from the metal patterns 127 and 325, as well as the semiconductor die 340 and 350, and the leadframe 110. As noted herein, this can provide advantages in high voltage applications, such as with respect to efficiency of PCB layout and/or proximity of other components to the package 100 on a PCB.

As shown in FIG. 3, in this example, the molding compound 130, which can be an epoxy molding compound, or other molding compound, can encapsulate (fully encapsulate) the spacer 315 (and other spacers not shown in FIG. 3), the first semiconductor die 340 and the second semiconductor die 350. As further shown in FIG. 3 for this example, the molding compound 130 can partially encapsulate (at least partially encapsulate) the leadframe 110, the DBM substrate 120 and the DBM substrate 320. For instance, signal leads (e.g., gull-wing leads) of the leadframe 110 can extend outside the molding compound 130, while other portions of the leadframe 110, including the DAP 310, are encapsulated within the molding compound 130. Also, the metal pattern 125 (of the substrate 120) and the metal pattern 325 (of the substrate 320), as shown in FIG. 3, are exposed through the molding compound, while other portions of the substrates 120 and 320 are encapsulated within the molding compound 130.

FIG. 3 also illustrates, for this example, a creepage distance CD between the signal leads of the leadframe portion 110a (e.g., common drain of the MOSFETs) and the leadframe portion 110b (e.g., common source of the MOSFETs). In some implementations, CD can be greater than or equal to 10 millimeters, greater than or equal to 15 millimeters, greater than or equal to 30 millimeters, greater than or equal to 25 millimeters, etc. In this example, because multiple power semiconductor die (e.g., power MOSFETs) are coupled to opposite sides of the DAP 310, the package 100 can have very low electrical impedance (inductance), e.g., due to the connection length and electrical path width between the MOSFET drain contacts of the semiconductor die 340 and 350).

FIG. 4 is a diagram illustrating a bonded-metal pattern (e.g., the bonded-metal pattern 127) of a substrate (e.g., the substrate 125) included in a semiconductor device package, such as the semiconductor device package 100 of FIG. 1, according to an implementation. Similarly, FIG. 5 is a diagram illustrating a bonded-metal pattern (e.g., the bonded-metal pattern 327) of another substrate (e.g., the substrate 325) included in a semiconductor device package, such as the semiconductor device package 100 of FIG. 1, according to an implementation. Reference numbers corresponding with elements of the package 100 shown in FIGS. 1-3 are included in FIGS. 4 and 5 for purposes of illustration and comparison with FIGS. 1-3. Those elements are not, however, discussed in detail again with respect to FIGS. 4 and 5.

As with FIG. 1, aspects of the package 100 (e.g., the patterns 127 and 327) shown in FIGS. 4 and 5 may be not be visible in example implementations. For instance, the patterns 127 and 327 may be disposed internal to the package 100 (e.g., within the molding compound 130 and on opposing sides of the substrates 120 and 320 that are exposed through the molding compound 130). Accordingly, the patterns 127 and 217 would not be externally visible in an implementation of the package 100, such as in the example implementation illustrated in FIGS. 4 and 5.

FIG. 4 shows an example bonded metal pattern 127 that can be implemented on, for example, the substrate 120 shown in FIGS. 1 and 3, while FIG. 5 shows an example bonded metal pattern 327 that can be implemented on, for example, the substrate 320 shown in FIG. 3. As with the example of FIG. 3, the example of FIGS. 4 and 5 is discussed where the first semiconductor die 340 and the second semiconductor die 350 implement, respectively, a first power MOSFET and a second power MOSFET. Referring to FIG. 4, the pattern 127 includes a first portion 127b, a second portion 127c and a third portion 127d. Similarly, referring to FIG. 5, the pattern 327 includes a first portion 327b, a second portion 327c and a third portion 327d. As can be seen in FIGS. 4 and 5, in some implementations, the patterns 127 and 327 can have mirror symmetry. Such mirror symmetry may allow for the use of semiconductor die 340 and 350 having a same layout in the package 100 and to connect with the leadframe portions 110b, 110c and 110b, such as shown in FIGS. 4 and 5 (e.g., to implement the circuit 200).

For instance, n this example, the portions 127b and 327b of the patterns 125 and 325 can be electrically coupled with respective source connections of MOSFETs of the semiconductor die 340 and 350, and can also be electrically coupled to (soldered to, etc.) the leadframe portion 110b (e.g., with or without using a conductive spacer, depending the particular implementation, and/or the particular substrate and leadframe). The portions 127c and 327c of the patterns 125 and 325 can be electrically coupled with respective gate connections of the semiconductor die 340 and 350, and can also be electrically coupled to (soldered to, etc.) the leadframe portion 110c (e.g., with or without using a conductive spacer, depending the particular implementation, and/or the particular substrate and leadframe). Also, the portions 127d and 327d of the patterns 125 and 325 can be electrically coupled with respective source connections of the semiconductor die 340 and 350, and be electrically coupled to (soldered to, etc.) the leadframe portion 110d (e.g., with or without using a conductive spacer, depending the particular implementation, and/or the particular substrate and leadframe), as a source-sense terminal.

Figure 6A:
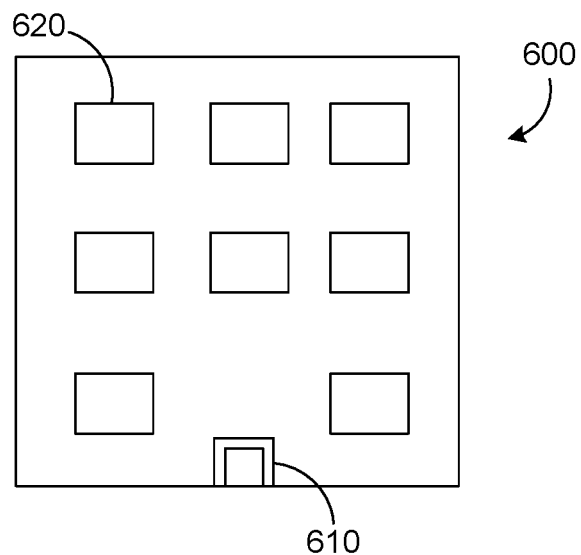
FIGS. 6A-6B are diagrams illustrating a power semiconductor die that can be implemented in the semiconductor device packages described herein.
Figure 6B:
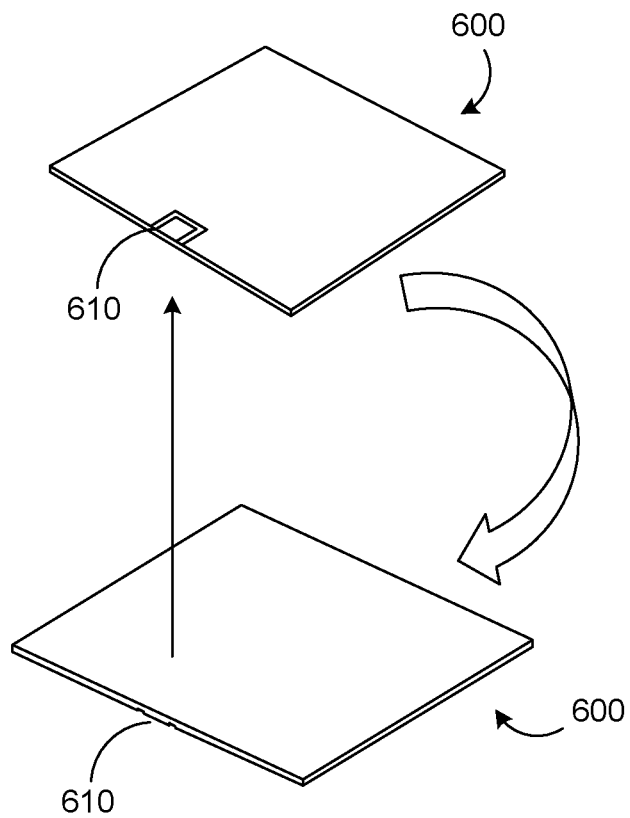

FIG. 6A is a diagram illustrating a power semiconductor die 600 that can be implemented in the semiconductor device packages described herein, such as in implementations of the package 100. In this example, as with the examples discussed above, the semiconductor die 600 can include a power MOSFET device, and can be used to implement, e.g., both the semiconductor die 340 and 350 of FIGS. 3-5. As shown in FIG. 6, the die 600 can have a gate connection 610 that is centrally located along one edge of the die 600. The die 600 can also include plurality of source connections 620 on a same side of the die 600 as the gate connection 610, with the back side of the die 600 being a drain contact. As shown in FIG. 6B, inverting the die 600 results in the gate connection 610 being in a same relative position (e.g., centrally located) along the edge of the die 600 discussed with respect to FIG. 6A. By arranging the source connections 620 of the die 600 such that they appropriately align with the metal pattern 127 (e.g., portions 127b and 127d) and 327 (e.g., portions 327b and 327d), semiconductor die with a same layout, along with the mirror-symmetric patterns 127 and 327 can be used to implement the package 100, such as in the implementations described herein.

FIGS. 7A-7C are diagrams illustrating a direct-bonded metal (DBM) substrate that can be included in a semiconductor device package, according to an implementation. For instance, FIGS. 7A-7C illustrate, by way of example, an implementation of the substrate 320 shown in FIG. 5. As shown in FIG. 7A, the bonded-metal pattern 325 (e.g., for use in heat dissipation) can be disposed on a first side of the substrate 320. As shown in FIB. 7B, the metal pattern 327 (including portions 327b, 327c and 327d) can be disposed on a second side of the substrate 320, where the second side of the substrate 320 is opposite the first side of the substrate 320. For instance, FIG. 7C illustrates the pattern 325 disposed on a first side of the substrate 320, while the pattern 327 is disposed on an opposite side of the substrate 320, resulting in the pattern 325 being electrically isolated from the pattern 327. In some implementations, the substrate 120 of FIG. 4 (and in implementations of the package 100) can be similarly implemented, where the bonded-metal pattern 127 of the substrate 120 is mirror-symmetric with the bonded-metal pattern 327.

Figure 8:
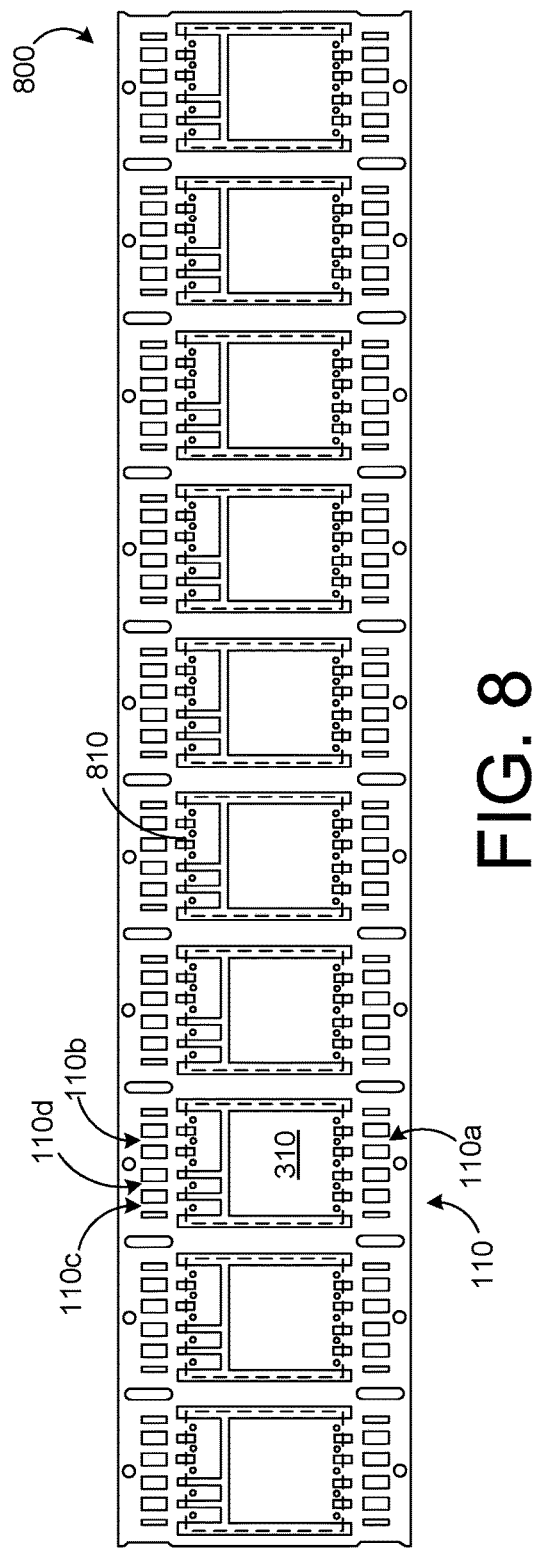
FIG. 8 is a diagram illustrating a leadframe strip including a plurality of leadframes that can be included in a semiconductor device package, according to an implementation.

FIG. 8 is a diagram illustrating a leadframe strip 800 including a plurality of leadframes 110 that can each be included in a semiconductor device package (e.g., implementations of the package 100), according to an implementation. In FIG. 8, dashed line boxes 810 are used to indicate where DBM substrates (such as the substrates 120 and 320) and semiconductor die coupled with those substrates may be coupled with the leadframes 110, such as in an assembly manufacturing process, such as the process shown in FIG. 10. The portions (e.g., portions 110a-110d) of the leadframes 110 illustrated in FIGS. 1 and 3-5 are likewise indicated in FIG. 8. In FIG. 8, however, the leadframes 110 are illustrated in the leadframe strip 800 (e.g., prior to trimming and forming) of the leadframes 110 (e.g., to define separate signal leads and/or to form gull-wing signal leads).

FIG. 9 is a diagram illustrating a semiconductor device package (e.g., an implementation of the package 100) coupled with a PCB 900, according to an implementation. In FIG. 9, the implementation of the package 100 shown in FIG. 3 is shown after being coupled to (e.g., soldered to, etc.) the PCB 900. As shown in FIG. 9, the signal leads (e.g., gull-wing signal leads) can be soldered to the PCB 900 using solder connections 920. As also shown in FIG. 9, the bonded-metal pattern 325 of the substrate 320 can be coupled with a PCB power pattern (e.g., PCB power plane) 910 of the PCB 900. In some implementations, the PCB power pattern 910 can be electrically grounded (e.g., can be a ground plane of the PCB 900). In this example, the PCB power pattern 910 can improve thermal dissipation of the package 100 and, along with a heat sink that can be coupled with the bonded-metal pattern 125 of the substrate 120, can provide efficient, dual-sided cooling for the package 100.

Figure 10:
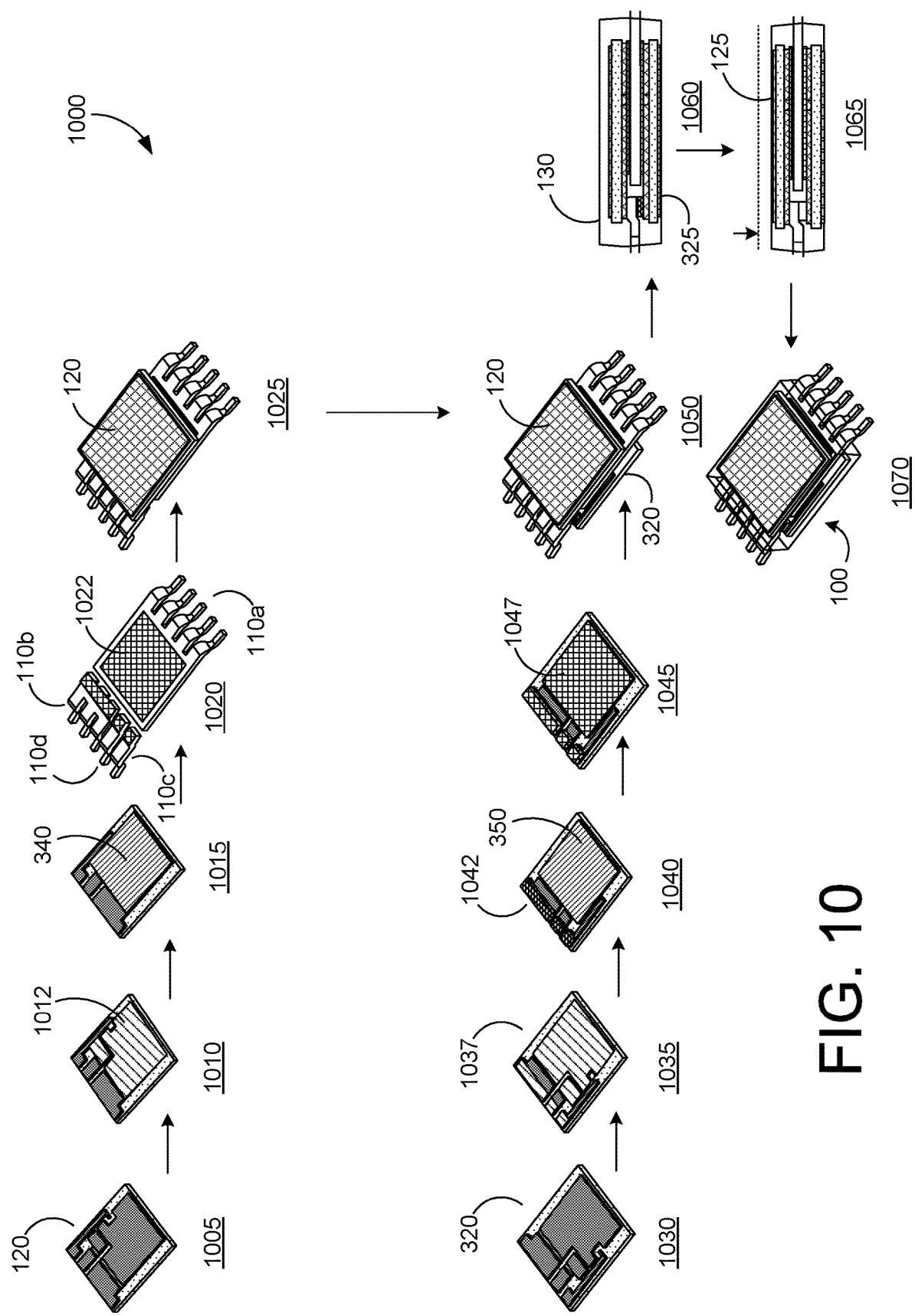
FIG. 10 is a diagram illustrating a method of producing a semiconductor device package, such as the semiconductor devices packages described herein, according to an implementation.

FIG. 10 is a diagram illustrating a method 1000 of producing a semiconductor device package, such as the semiconductor device packages described herein, according to an implementation. For purposes of illustration, the method 1000 is described with respect to producing an implementation of the package 100, such illustrated in FIGS. 1 and 3-5. Accordingly, the method 1000 is described with further reference to FIGS. 1 and 3-5. In some implementations, the method 1000 can be used to produce semiconductor device packages having other configurations. In some implementations, one or more of the operations of the method 1000 can be performed using appropriate alignment tools or jigs. Further, multiple semiconductor device packages can be produced together, e.g., using the leadframes 110 of the leadframe strip 800.

In the method 1000, a first sub-assembly can be produced by operation 1105 through operation 1025. Further in the method 1000, a second sub-assembly can be produced by operations 1030 through 1045. At operation 1050, the two sub-assemblies can be combined (joined, married, etc.) to form a single (integrated) assembly.

In FIG. 10, producing the first sub-assembly can begin at operation 1005 with the substrate 120. At operation 1010, a solder printing pattern 1012 can be formed on the bonded metal pattern 127 of the substrate 120. In some implementations, the solder printing at operation 1010 can be performed using a high-lead (high-Pb) content solder cream (e.g., with a lead content of greater than 85%), a sintering material, or other conductive material for coupling the first semiconductor die 340 with the substrate 120. At operation 1015, the semiconductor die 340 can be flip-chip mounted on the solder print of operation 1010, and a reflow operation can be performed to couple (electrically and fixedly couple) the semiconductor die 340 with the substrate 120.

At operation 1020, solder preforms, or solder paste 1022 can be disposed on the leadframe 110 (e.g., on the portions 110a-110d, as shown in FIG. 10). In some implementations, the solder preforms or paste 1022 of operation 1020 can include tin(Sn)-silver(Ag)-copper(Cu) solder (SAC solder preforms or paste). The solder preform or paste 1022 of operation 1020 can have a lower melting point than the solder, sintering or other materials used at operation 1010. This difference in melting points can prevent a second reflow of the material from operation 1010 when reflowing the material from operation 1020 (and the operation 1045) to form the integrated assembly at operation 1050. At operation 1025, the substrate 120 and the semiconductor die 340 can be flip mounted onto the solder preforms or paste 1022.

In the method 1000, producing the second sub-assembly can begin at operation 1030 with the substrate 320. At operation 1035, a solder printing pattern 1037 can be formed on the bonded metal pattern 327 of the substrate 320. In some implementations, the solder printing at operation 1030 (as with the operation 1010) can be performed using a high-lead (high-Pb) content solder cream (e.g., with a lead content of greater than 85%), a sintering material, or other conductive material for coupling the first semiconductor die 350 with the substrate 320. At operation 1040, the semiconductor die 350 can be flip-chip mounted on the solder print of operation 1035. Further at operation 1040, spacers 1042 (for forming respective electrical connections between the bonded metal pattern 327 and the leadframe portions 110b-110d) can be placed on corresponding portions of the solder print of operation 1035, and a reflow operation can be performed to couple (electrically and fixedly couple) the semiconductor die 350 and the spacers 1042 with the substrate 320.

At operation 1045, solder preforms, or solder paste 1047 can be disposed on the die 350 and the spacers 1042. As with the operation 1020, in some implementations, the solder preforms or paste 1047 of operation 1045 can include SAC solder preforms or paste, so that the solder preform or paste 1047 of operation 1045 has a lower melting point than the solder, sintering or other materials used at operation 1035 (and at operation 1010). This difference in melting points can prevent a second reflow of the material from operations 1010 and 1035 when reflowing the material from operation 1020 (and operation 1045) to form the integrated assembly at operation 1050.

At operation 1050, the sub-assembly from operation 1025 and the sub-assembly from operation 1045 can be aligned with each other (e.g., using an alignment a jig) in the arrangement shown in operation 1050 of the method 1000. A reflow operation can then be performed (e.g., at the lower melting point for the materials used in operations 1020 and 1045. The reflow at operation 1050 can produce an integrated assembly that includes the two sub-assemblies discussed above. At operation 1060, a molding operation can be performed to encapsulate the integrated assembly of operation 1050 (such as is shown in operation 1060 of the method 1000) in a molding compound 130 (e.g., an epoxy or other molding compound). At operation 1065, a grind can be performed to remove a thickness G of the molding compound 130, e.g., to expose the bonded-metal pattern 125 of the substrate 120. In FIG. 10, the signal leads of the semiconductor device package 100 are not shown for operations 1060 and 1065. After the grind operation of 1065, further operations (e.g., singulation, clean, deflash, dejunk, electrical test etc.) can be performed at operation 1070 to complete manufacturing of the semiconductor device package 100 of this example.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Silicon Carbide (SiC), Gallium Arsenide (GaAs), Gallium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus comprising:
a leadframe having a first portion, a second portion and a third portion;
a first semiconductor die having a first side coupled with a first side of the first portion of the leadframe;
a second semiconductor die having a first side coupled with a second side of the first portion of the leadframe;
a first substrate including a ceramic, the first substrate having a first side coupled with a second side of the first semiconductor die, the first side of the first substrate being further coupled with a first side of the second portion of the leadframe and a first side of the third portion of the leadframe;
a second substrate including a ceramic, the second substrate having a first side coupled with a second side of the second semiconductor die, the first side of the second substrate being further coupled with a second side of the second portion of the leadframe and a second side of the third portion of the leadframe; and
a molding compound fully encapsulating the first semiconductor die and the second semiconductor die, and partially encapsulates the leadframe, the first substrate and the second substrate,
the leadframe including a plurality of signal leads disposed outside the moulding compound,
a second side of the first substrate and second side of the second substrate being exposed through the molding compound.

2. The apparatus of claim 1, wherein the first portion of the leadframe includes a die attach paddle,
the first semiconductor die being coupled with a first side of the die attach paddle, and
the second semiconductor die being coupled with a second side of the die attach paddle.

3. The apparatus of claim 1, wherein:
the first semiconductor die includes a first power transistor device; and
the second semiconductor die includes a second power transistor device that is electrically connected in parallel with the first power transistor device.

4. The apparatus of claim 3, wherein:
the first power transistor device is a first metal-oxide field-effect transistor (MOSFET);
the second power transistor device is a second MOSFET;
the first portion of the leadframe being electrically coupled with a drain terminal of the first MOSFET and a drain terminal of the second MOSFET;
the second portion of the leadframe being electrically coupled with a source terminal of the first MOSFET and a source terminal of the second MOSFET; and
the third portion of the leadframe being electrically coupled with a gate terminal of the first MOSFET and a gate terminal of the second MOSFET.

5. The apparatus of claim 4, wherein the leadframe further includes a fourth portion, the fourth portion of the leadframe being electrically coupled with a source-sense terminal of the first MOSFET and a source-sense terminal of the second MOSFET.

6. The apparatus of claim 3, wherein:
the first power transistor device is a first insulated-gate bipolar transistor (IGBT);
the second power transistor device is a second IGBT;
the first portion of the leadframe is electrically coupled with a collector terminal of the first IGBT and a drain terminal of the second IGBT;

the second portion of the leadframe is electrically coupled with an emitter terminal of the first IGBT and an emitter terminal of the second IGBT; and the third portion of the leadframe is electrically coupled with a gate terminal of the first IGBT and a gate terminal of the second IGBT.

7. The apparatus of claim 1, wherein:

the second side of the first substrate is electrically isolated from the first side of the first substrate;

the second side of the second substrate is electrically isolated from the first side of the second substrate; and the second side of the first substrate is electrically isolated from the second side of the second substrate.

8. The apparatus of claim 1, wherein:

the second side of the first substrate and the second side of the second substrate are configured to dissipate heat produced by the first semiconductor die and the second semiconductor die.

9. The apparatus of claim 1, wherein:

the first portion of the leadframe includes a first plurality of signal leads disposed along a first edge of the apparatus, each signal lead of the first plurality of signal leads having a respective circuit board contact surface;

the second portion of the leadframe includes a second plurality of signal leads disposed along a second edge of the apparatus, each signal lead of the second plurality of signal leads having a respective circuit board contact surface; and a shortest distance between a contact surface of the respective contact surfaces of the first plurality of signal leads and a contact surface of the respective contact surfaces of the second plurality of signal leads is greater than 10 millimeters.

10. The apparatus of claim 1, wherein:

the second substrate is coupled with the second side of the second portion of the leadframe via a first spacer; and the second substrate is coupled with the second side of the third portion of the leadframe via a second spacer.

11. The apparatus of claim 1, wherein:

the first semiconductor die includes a first metal-oxide field-effect transistor (MOSFET);

the second semiconductor die includes a second MOSFET;

the first portion of the leadframe is electrically coupled with a drain terminal of the first MOSFET and a drain terminal of the second MOSFET;

the second portion of the leadframe is electrically coupled, via the first substrate, with a source terminal of the first MOSFET and, via the second substrate and a first spacer, with a source terminal of the second MOSFET; and the third portion of the leadframe is electrically coupled, via the first substrate, with a gate terminal of the first MOSFET and, via the second substrate and a second spacer, with a gate terminal of the second MOSFET.

12. The apparatus of claim 11, wherein:

the leadframe includes a fourth portion, the fourth portion of the leadframe being electrically coupled, via the first substrate, with a source-sense terminal of the first MOSFET and, via the second substrate and a third spacer, with a source-sense terminal of the second MOSFET.

13. An apparatus comprising:

a first direct bonded-metal (DBM) substrate;

a first semiconductor die that is flip-chip mounted on the first DBM substrate;

a second DBM substrate;

a second semiconductor die that is flip-chip mounted on the second DBM substrate; and a leadframe having a first portion including a die attach paddle (DAP), a second portion and a third portion, the first semiconductor die being coupled with a first side of the DAP;

the second semiconductor die being coupled with a second side of the DAP, the first DBM substrate being coupled with a first side of the second portion of the leadframe and a first side of the third portion of the leadframe, the second DBM substrate being coupled, via a first spacer, with a second side of the second portion of the leadframe and, via a second spacer, a second side of the third portion of the leadframe, the first spacer being vertically disposed, with respect to the second side of the second portion of the leadframe, between the second DBM substrate and the second side of the second portion of the leadframe, and the second spacer being vertically disposed, with respect to the second side of the third portion of the leadframe, between the second DBM substrate and the second side of the third portion of the leadframe.

14. The apparatus of claim 13, wherein:

the first semiconductor die includes a first metal-oxide field-effect transistor (MOSFET);

the second semiconductor die includes a second MOSFET;

the DAP is electrically coupled with a drain terminal of the first MOSFET and a drain terminal of the second MOSFET;

the second portion of the leadframe is electrically coupled, via the first DBM substrate, with a source terminal of the first MOSFET and, via the second DBM substrate, with a source terminal of the second MOSFET; and the third portion of the leadframe is electrically coupled, via the first DBM substrate, with a gate terminal of the first MOSFET and, via the second DBM substrate, with a gate terminal of the second MOSFET.

15. The apparatus of claim 14, wherein the leadframe further includes a fourth portion, the fourth portion of the leadframe being electrically coupled, via the first DBM substrate, with a source-sense terminal of the first MOSFET and, via a third spacer and the second DBM substrate, a source-sense terminal of the second MOSFET.

16. The apparatus of claim 13, wherein:

the first DBM substrate is a first direct-bonded copper (DBC) substrate; and the second DBM substrate is a second DBC substrate.

17. The apparatus of claim 13, wherein:

the first semiconductor die is flip-chip mounted on a metal pattern of the first DBM substrate; and the second semiconductor die is flip-chip mounted on a metal pattern of the second DBM substrate, the metal pattern of the second DBM substrate being mirror symmetric with the metal pattern of the first DBM substrate.

18. A method comprising:

constructing a first sub-assembly including:

coupling a first side of a first semiconductor die with a first direct-bonded metal (DBM) substrate;

coupling a second side of the first semiconductor die with a first side of a first leadframe portion;
coupling the first DBM substrate with a first side of a second leadframe portion; and
coupling the first DBM substrate with a second side of a third leadframe portion;
constructing a second sub-assembly including:
coupling a first side of a second semiconductor die with a second DBM substrate;
coupling a first spacer with the second DBM substrate; and
coupling a second spacer with the second DBM substrate; and
constructing an assembly by coupling the second sub-assembly with the first sub-assembly including:
coupling a second side of the second semiconductor die with a second side of the first portion of the leadframe;
coupling the first spacer with a second side of the second portion of the leadframe; and
coupling the second spacer with a second side of the third portion of the leadframe,
the first spacer being vertically disposed, with respect to the second side of the second portion of the leadframe, between the second DBM substrate and the second side of the second portion of the leadframe, and the second spacer being vertically disposed, with respect to the second side of the third portion of the leadframe, between the second DBM substrate and the second side of the third portion of the leadframe.

19. The method of claim 18, wherein:
the first sub-assembly and the second sub-assembly are each constructed using a first conductive material having a first melting point; and
the second sub-assembly is coupled with the first sub-assembly using a second conductive material having a second melting point that is less than the first melting point.

20. The method of claim 19, wherein:
the first conductive material is one of a sintering material or a lead-containing solder material; and
the second conductive material is a lead-free solder material.

21. The method of claim 18, further comprising:
molding the assembly with a molding compound such that:
the first semiconductor die, the second semiconductor die and the first DBM substrate are fully encapsulated in the molding compound; and
the leadframe and the second DBM substrate are partially encapsulated in the molding compound, the leadframe including a plurality of signal leads at least partially disposed outside the molding compound and a surface of the second DBM substrate being exposed outside the molding compound; and
grinding the molding compound to expose a surface of the first DBM substrate through the molding compound.

* * * * *